(12) United States Patent
Aguilar et al.

(10) Patent No.: US 11,716,807 B2
(45) Date of Patent: Aug. 1, 2023

(54) POWER AND COMMUNICATION HANDGUARD

(71) Applicant: VK Integrated Systems, Inc., Fullerton, CA (US)

(72) Inventors: Steve I. Aguilar, Fullerton, CA (US); Vasilios K. Kapogianis, Fullerton, CA (US)

(73) Assignee: Fieldpiece Instruments, Inc.

(*) Notice: Subject to any disclaimer, the term of this patent is extended or adjusted under 35 U.S.C. 154(b) by 0 days.

(21) Appl. No.: 17/547,163

(22) Filed: Dec. 9, 2021

(65) Prior Publication Data
US 2023/0189428 A1 Jun. 15, 2023

(51) Int. Cl.
*F41G 11/00* (2006.01)
*F41C 23/16* (2006.01)
*H05K 1/02* (2006.01)
*H05K 1/11* (2006.01)

(52) U.S. Cl.
CPC ........... *H05K 1/0213* (2013.01); *F41C 23/16* (2013.01); *F41G 11/003* (2013.01); *H05K 1/11* (2013.01)

(58) Field of Classification Search
CPC ..... F41C 23/16; F41G 11/003; H05K 1/0213; H05K 1/11
See application file for complete search history.

(56) References Cited

U.S. PATENT DOCUMENTS

| | | | | |
|---|---|---|---|---|
| 7,640,690 B2 * | 1/2010 | Hines | F41C 23/16 42/84 |
| 7,975,419 B2 * | 7/2011 | Darian | F41C 27/00 42/84 |
| 8,091,265 B1 * | 1/2012 | Teetzel | F41C 23/16 42/71.01 |
| 8,146,282 B2 * | 4/2012 | Cabahug | F41C 23/22 42/72 |
| 8,151,505 B2 * | 4/2012 | Thompson | F41C 27/00 42/84 |
| 8,225,542 B2 * | 7/2012 | Houde-Walter | F41C 23/16 42/72 |
| 8,322,064 B2 * | 12/2012 | Cabahug | F41C 27/00 42/71.01 |
| 8,347,541 B1 * | 1/2013 | Thompson | F41G 11/003 42/84 |
| 8,397,418 B2 * | 3/2013 | Cabahug | F41C 27/00 42/72 |
| 8,443,539 B2 * | 5/2013 | Cabahug | F41G 11/003 42/71.01 |
| 8,448,368 B2 * | 5/2013 | Cabahug | F41G 11/003 42/72 |
| 8,458,944 B2 * | 6/2013 | Houde-Walter | F41C 23/16 42/72 |
| 8,490,313 B2 * | 7/2013 | Frascati | F41G 11/003 42/72 |
| 8,516,731 B2 * | 8/2013 | Cabahug | F41G 11/003 42/72 |
| 8,776,422 B2 * | 7/2014 | Dodd | F41G 11/003 42/72 |

(Continued)

*Primary Examiner* — Michelle Clement
(74) *Attorney, Agent, or Firm* — Paul J. Backofen, Esq.

(57) ABSTRACT

The devices and methods described below provide for a forearm handguard for a rifle with multiple integrated power and communication channels that are accessible to any accessory through the different rail interface systems of the handguard. Any suitable rail interface systems may be used.

17 Claims, 7 Drawing Sheets

(56) References Cited

U.S. PATENT DOCUMENTS

| | | | | |
|---|---|---|---|---|
| 8,919,025 B2* | 12/2014 | Kuczynko | | F41A 5/18 42/71.01 |
| 9,200,867 B1* | 12/2015 | Swan | | F41C 23/16 |
| 9,279,639 B2* | 3/2016 | Hines | | F41C 23/22 |
| 10,458,754 B2* | 10/2019 | Miller | | F41G 11/003 |
| 10,477,618 B2* | 11/2019 | Downing | | F41G 9/00 |
| 10,551,149 B2* | 2/2020 | Teetzel | | F41C 23/16 |
| 10,976,131 B1* | 4/2021 | Cabahug | | F41C 23/16 |
| 11,231,253 B2* | 1/2022 | Miller | | H04B 3/54 |
| 2010/0031552 A1* | 2/2010 | Houde-Walter | | F41C 23/16 42/72 |
| 2010/0083553 A1* | 4/2010 | Montgomery | | F41C 27/00 42/84 |
| 2010/0180485 A1* | 7/2010 | Cabahug | | F41C 27/00 42/90 |
| 2010/0192443 A1* | 8/2010 | Cabahug | | F41C 23/16 42/71.01 |
| 2010/0192446 A1* | 8/2010 | Darian | | F41G 11/003 320/108 |
| 2010/0192448 A1* | 8/2010 | Darian | | F41G 11/003 42/84 |
| 2010/0218410 A1* | 9/2010 | Cabahug | | F41C 23/16 42/71.01 |
| 2011/0010979 A1* | 1/2011 | Houde-Walter | | F41C 27/00 42/84 |
| 2011/0173865 A1* | 7/2011 | Compton | | F41C 27/00 42/84 |
| 2012/0180363 A1* | 7/2012 | Frascati | | F41G 11/003 42/90 |
| 2012/0180364 A1* | 7/2012 | Berntsen | | F41G 11/003 42/90 |
| 2012/0192476 A1* | 8/2012 | Compton | | H04B 5/0037 42/84 |
| 2013/0061504 A1* | 3/2013 | Malherbe | | F41G 11/003 42/84 |
| 2013/0185978 A1* | 7/2013 | Dodd | | F41G 11/003 42/84 |
| 2014/0047754 A1* | 2/2014 | Compton | | F41G 11/00 42/84 |
| 2014/0360077 A1* | 12/2014 | Miller | | F41C 27/00 42/84 |
| 2015/0020427 A1* | 1/2015 | Compton | | F41G 11/003 42/71.01 |
| 2015/0041538 A1* | 2/2015 | Teetzel | | F41G 3/06 235/404 |
| 2015/0285599 A1* | 10/2015 | Downing | | H04W 4/30 89/1.11 |
| 2016/0025462 A1* | 1/2016 | Downing | | F41G 11/003 89/1.11 |
| 2016/0216082 A1* | 7/2016 | Downing | | F41G 3/06 |
| 2016/0377383 A1* | 12/2016 | Downing | | F41G 9/00 42/111 |
| 2017/0010073 A1* | 1/2017 | Downing | | F41C 27/00 |
| 2017/0122706 A1* | 5/2017 | Masarik | | G02B 6/4246 |
| 2019/0310051 A1* | 10/2019 | Cabahug | | F41C 27/00 |
| 2019/0353461 A1* | 11/2019 | Neal | | F41G 11/003 |
| 2020/0033096 A1* | 1/2020 | Sabaldan Elpedes | | F41G 1/30 |
| 2020/0141700 A1* | 5/2020 | Moseman | | G06F 1/266 |
| 2021/0140742 A1* | 5/2021 | Neal | | G02B 6/4206 |
| 2021/0391892 A1* | 12/2021 | Ellena | | H04L 12/10 |

* cited by examiner

POWER AND COMMUNICATION HANDGUARD

FIELD OF THE INVENTIONS

The inventions described below relate to the field of man portable weapons with integrated electronics.

BACKGROUND OF THE INVENTIONS

Man portable weapons provide a vital tool to military forces, police organizations and security forces. These tools have been traditionally focused on providing ever more efficient delivery of bullets to a selected target. Communications, coordination and targeting, when available, have always been handled by separate systems carried by users. Traditionally, small arms have not had the ability to support sophisticated electronics embedded and or attached to them. Systems traditionally have exposed cables and adapters attached in some way to the exterior surfaces of the receiver, handguard, rails, grip areas and the stock.

SUMMARY

The devices and methods described below provide for a forearm handguard for a rifle with integrated power and communication channels that are accessible to any accessory through the different rail interface systems of the handguard. Any suitable rail interface system may be used.

DETAILED DESCRIPTION OF THE INVENTIONS

Figure 1:
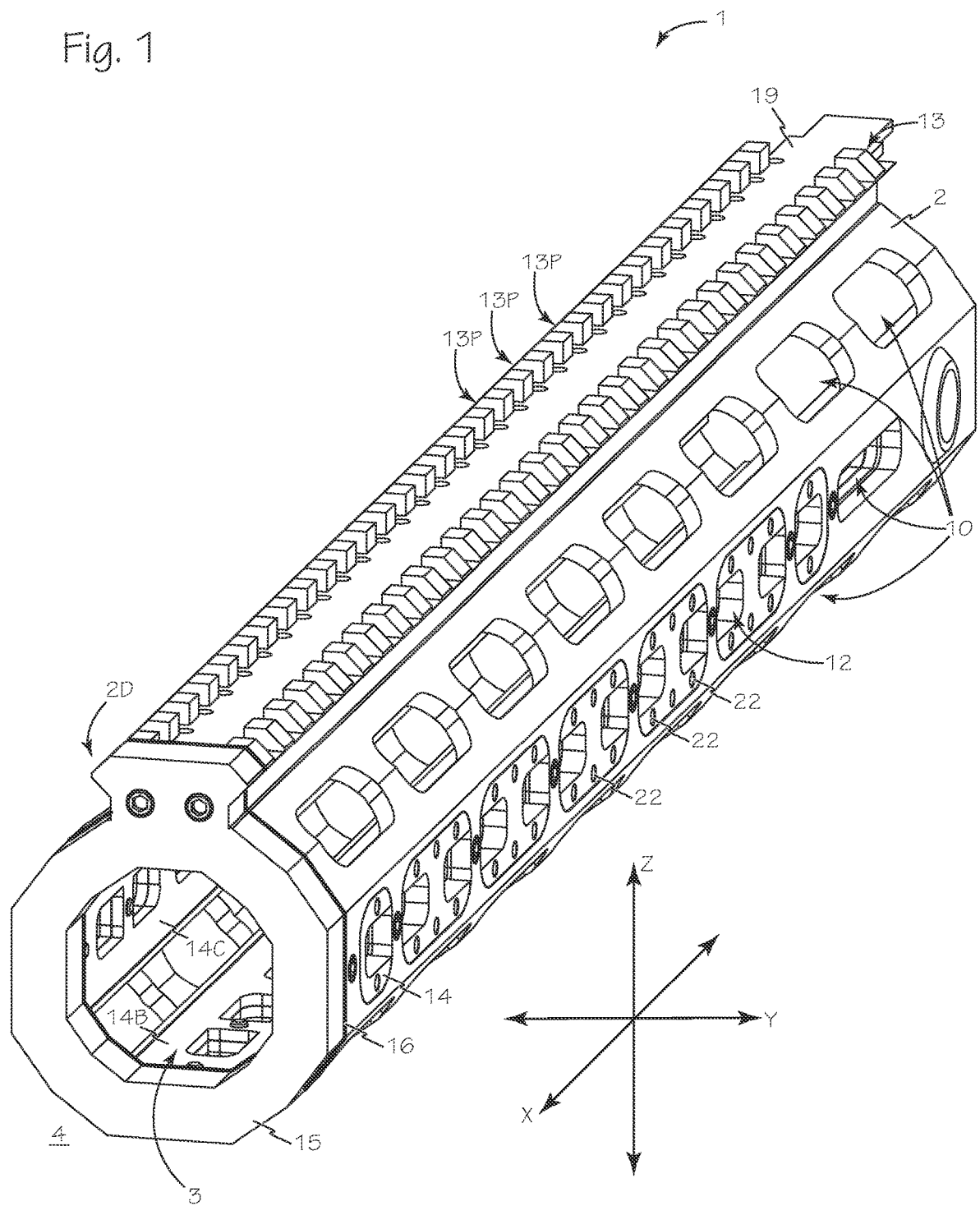
FIG. 1 is a left-front perspective view of the forearm handguard with power and communication channels.
Figure 2:
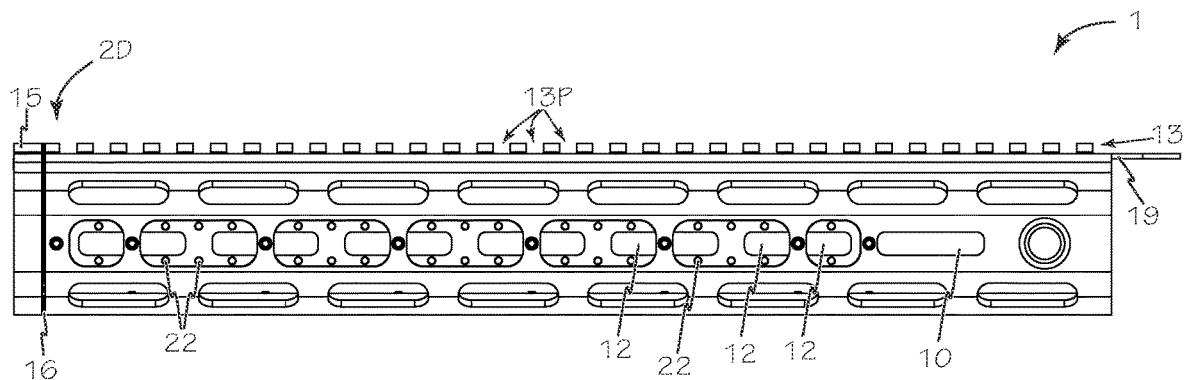
FIG. 2 is a left side view of the forearm handguard of FIG. 1.
Figure 3:
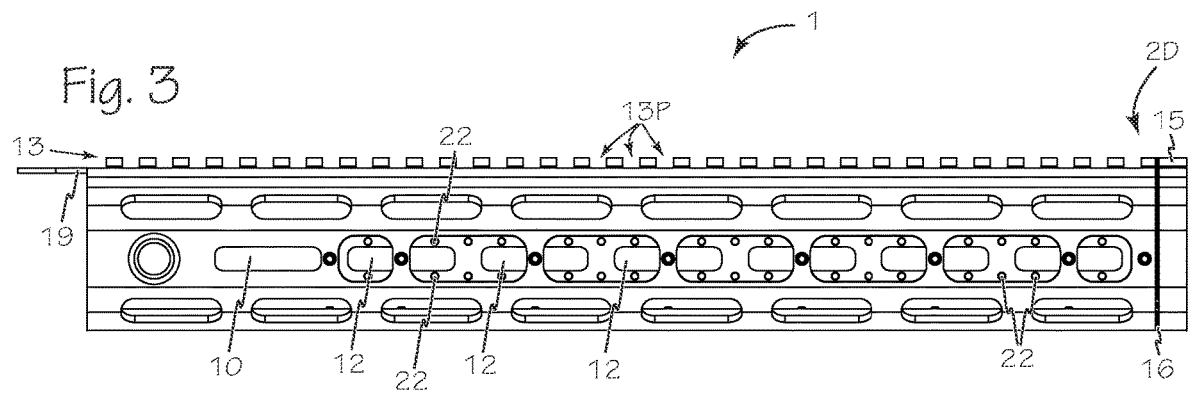
FIG. 3 is a right side view of the forearm handguard of FIG. 1.
Figure 4:
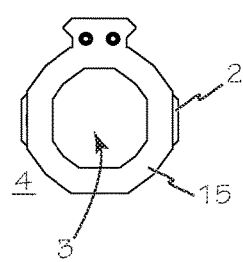
FIG. 4 is a front view of the forearm handguard of FIG. 1.
Figure 5:
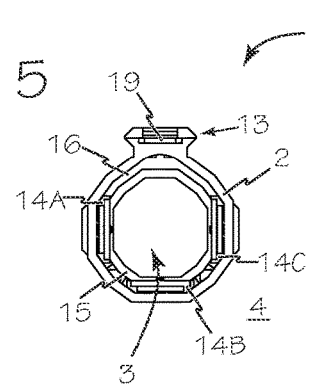
FIG. 5 is a rear view of the forearm handguard of FIG. 1.
Figure 6:
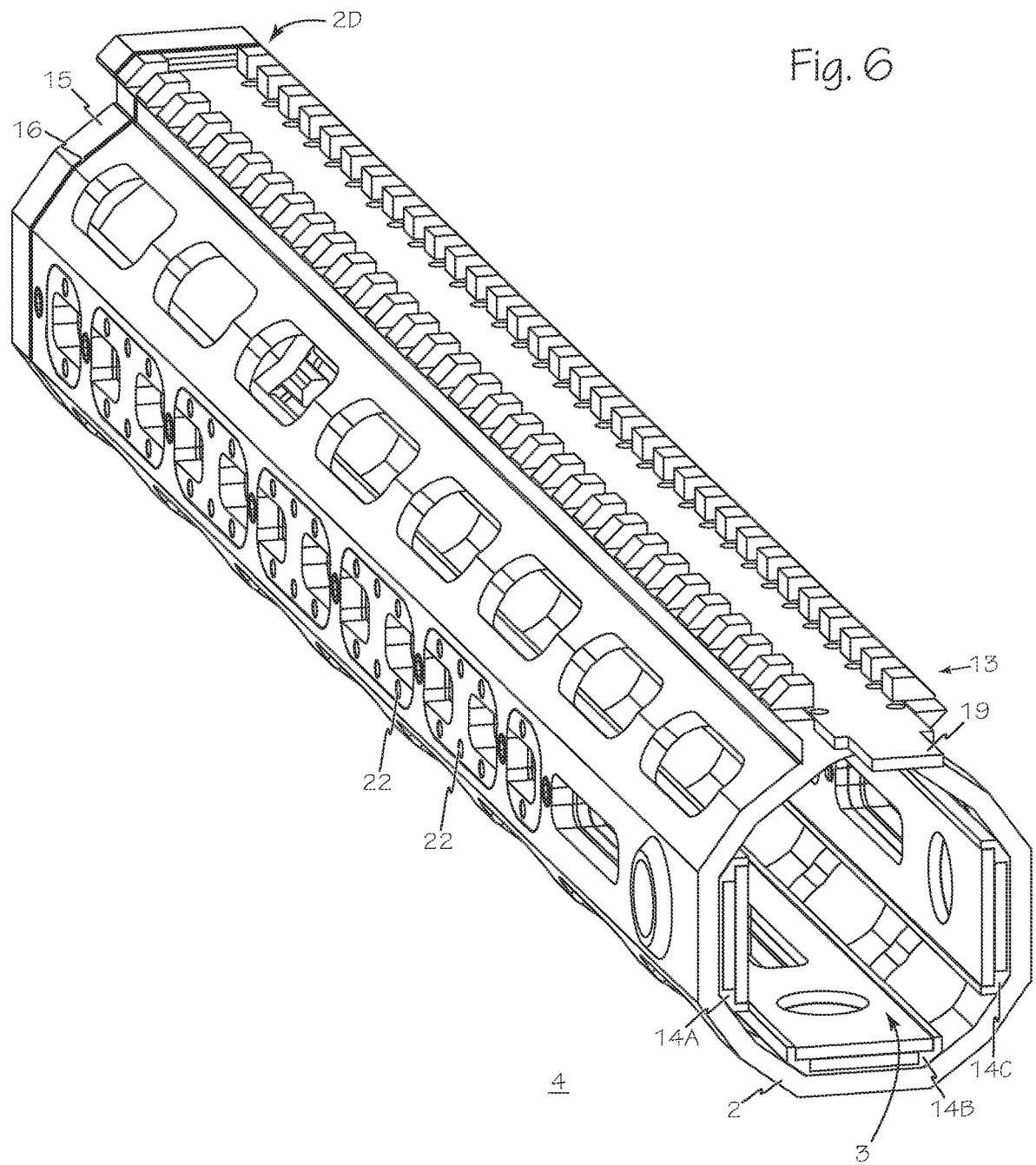
FIG. 6 is a left-rear perspective view of the forearm handguard of FIG. 1.

A forearm handguard 1 with power and communication channels is illustrated in FIGS. 1-6 and it includes handguard shell 2 with an inside 3 and an outside 4, a plurality of integrated M-Lok® attachment points 10 (M-LOK® is a registered trademark of Magpul Industries, Inc.) and hot M-Lok® attachment points 12 extend through the shell 2 from inside 3 to outside 4. Attachment points 10 and 12 are operable to ventilate the handguard. Top rail 13 is integrated on the top of shell 2. One or more electronic ribs 14A, 14B and 14C are secured within shell 2, and a front cap 15 and a front connector plate 16 are secured on the distal end 2D of the shell.

Figure 7:
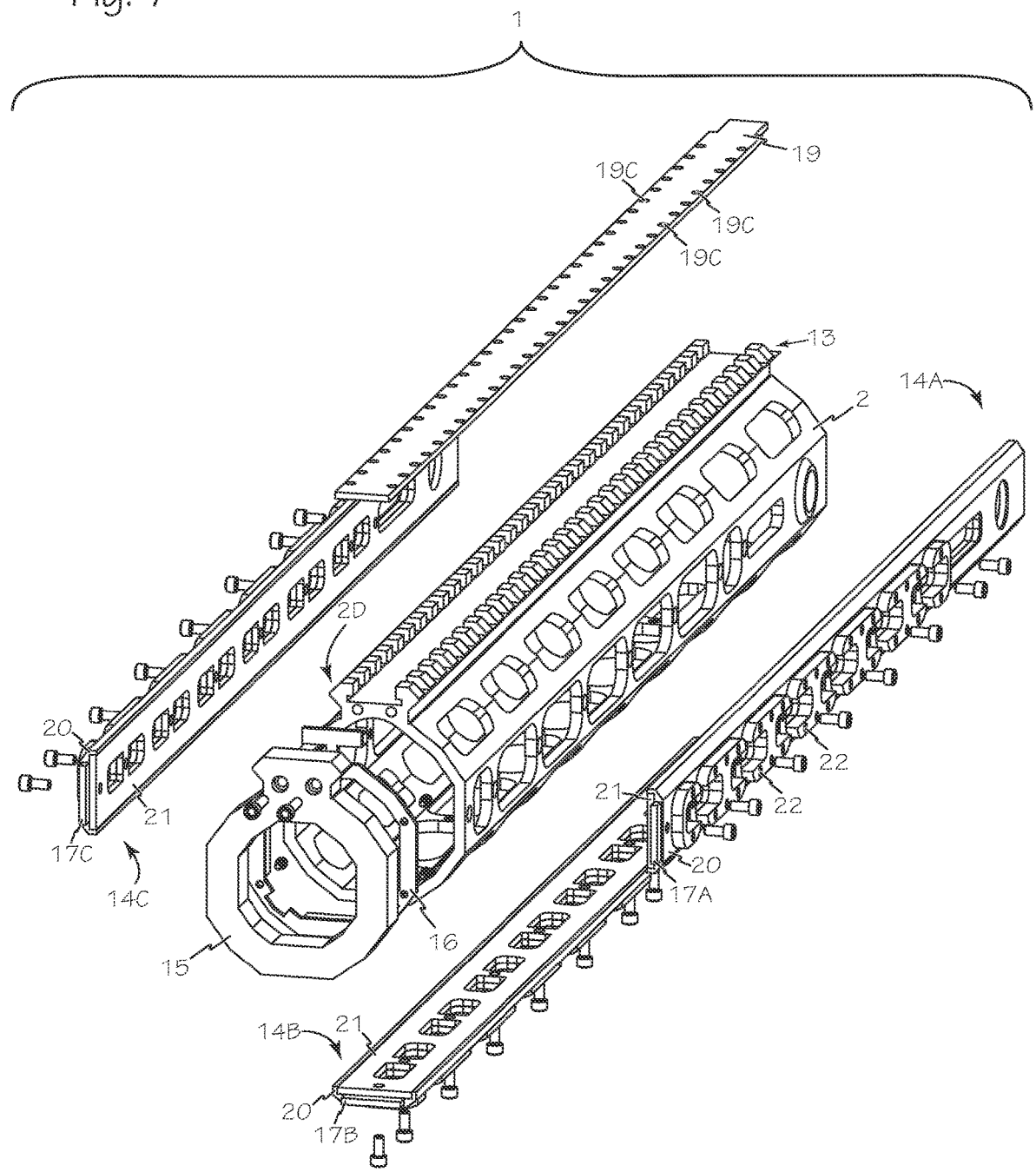
FIG. 7 is an exploded left-front perspective view of the forearm handguard of FIG. 1.
Figure 8:
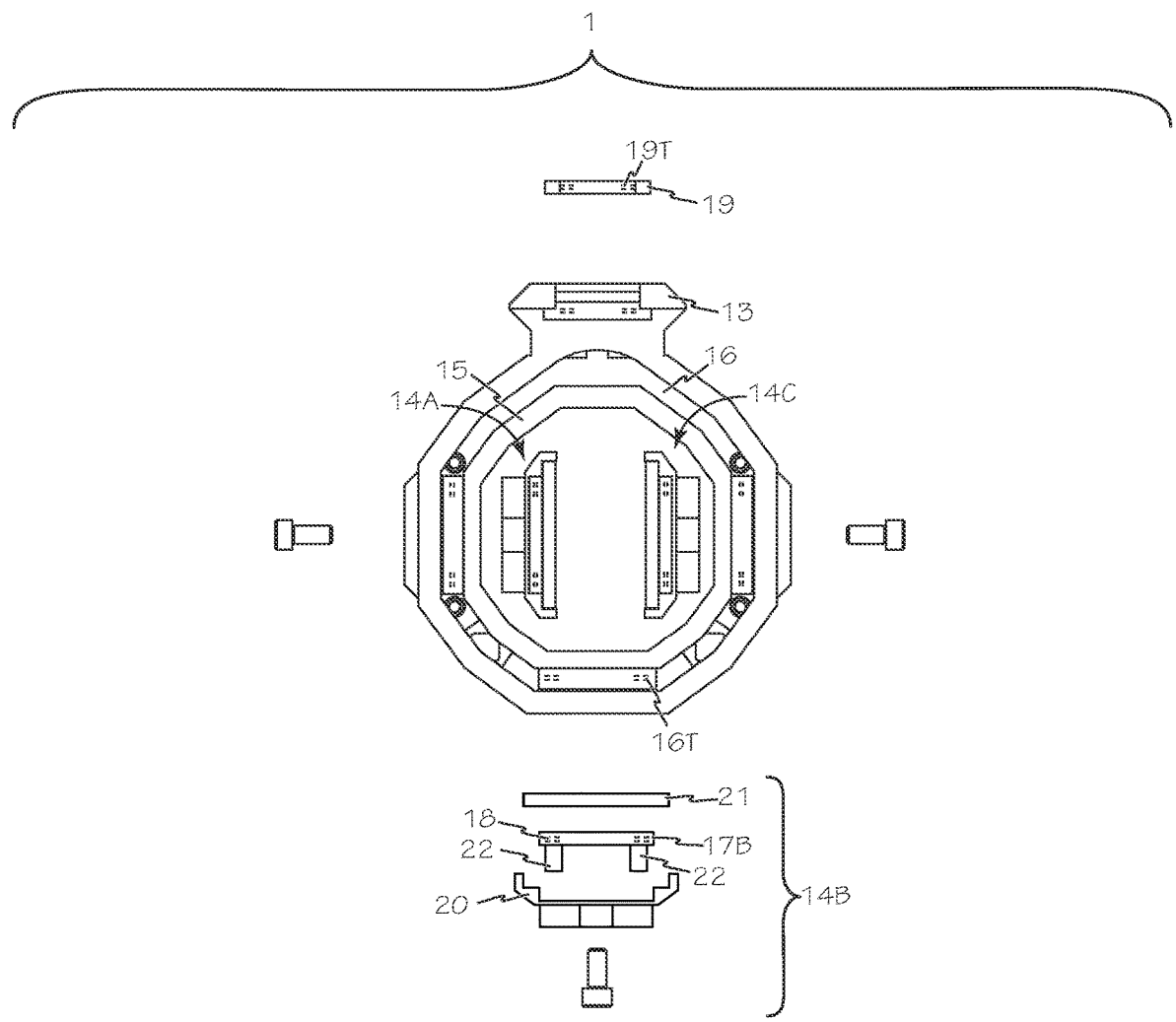
FIG. 8 is an exploded rear view of the forearm handguard of FIG. 1.
Figure 9:
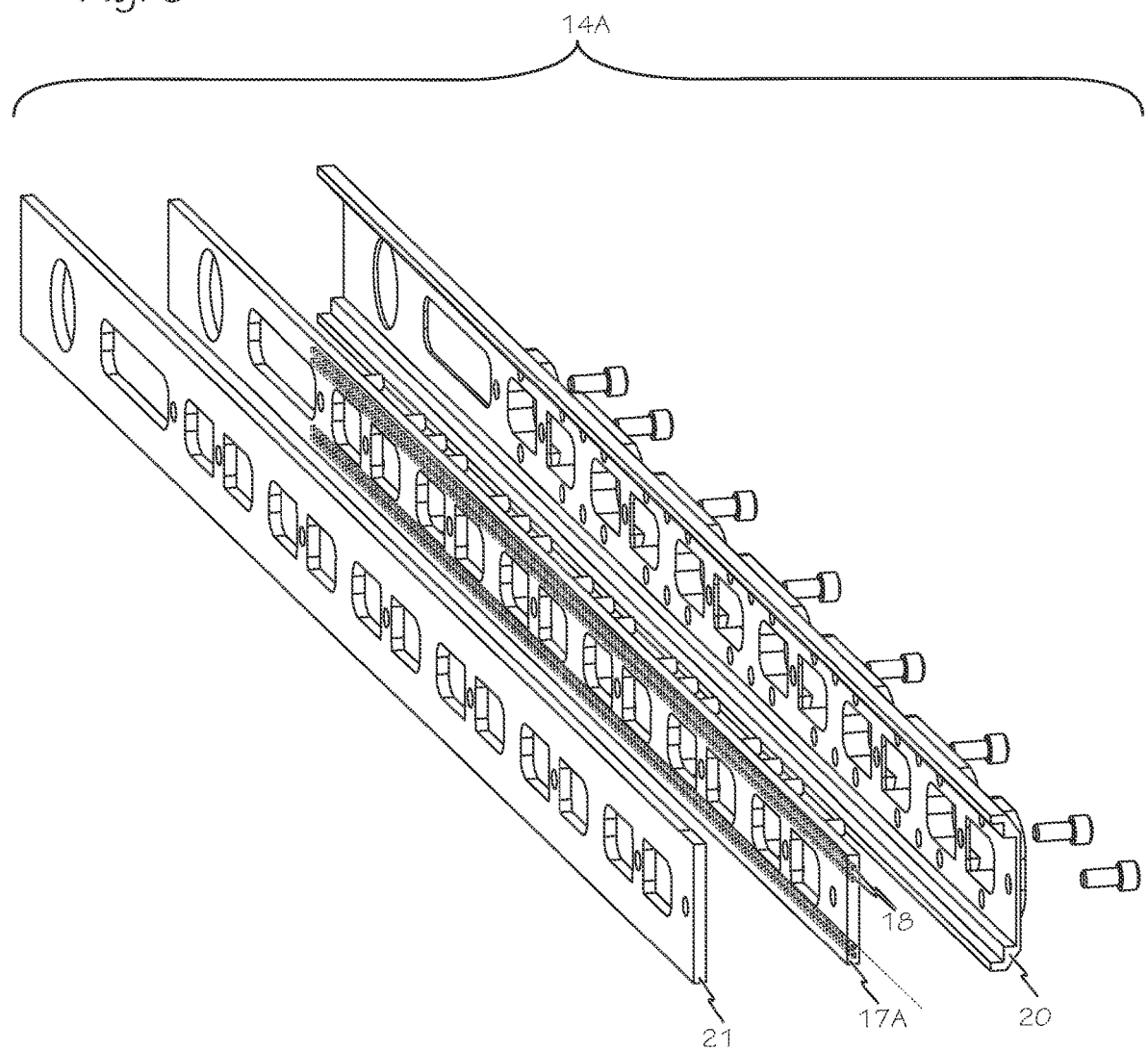
FIG. 9 is an exploded right-front perspective view of an electronic rib.

As shown in FIGS. 7, 8 and 9, each of the one or more electronic ribs 14A, 14B and 14C includes a printed circuit board (PCB) 17A, 17B and 17C respectively. Each printed circuit board is formed with one or more layers that includes one or more conductive traces 18 which are in electrical contact with one or more conductive traces 16T in the front connector plate 16. Similarly rail circuit board 19 and front connector plate 16 are printed circuit boards that have one or more layers of conductive traces such as traces 16T and 19T that are electrically connected to the conductive traces 18 to provide power and communication to and between any components mounted to first connection points such as connection point 13P on the top rail 13 or any of the hot M-LOK® attachment points 12 that are collocated with the electronic ribs 14A, 14B or 14C of forearm handguard 1. The rail circuit board 19 includes one or more connection points 19C to enable items secured to the integrated top rail to make an electrical connection to the electrical traces 19T and thereby to any other items secured to the integrated top rail or any of the hot M-Lok® attachment points 12 via the connection points 22 adjacent to the attachment points.

Each of the printed circuit boards are sandwiched between an insulating enclosure body 20 and an insulating lid 21. Printed circuit boards 17A, 17B and 17C may be configured similarly or differently as needed. Printed circuit boards 17A, 17B and 17C includes one or more connection points 22 mounted on the PCB board. The connection points 22 will extend from the printed circuit board through the insulating enclosure body 20 and will be accessible from the outside of the handguard. One or more connection points 22 of each printed circuit boards, a subset of the connection points, may be electrically connected to any one or more of the conductive traces 18 to provide power, commands, data and or communication through the conductive traces and the connection points. Similarly one or more of rail connection points 19C, a subset of the rail connection points, may be electrically connected to any one or more of the conductive traces 19T to provide power, commands, data and or communication through the conductive traces and the connection points.

Figure 10:
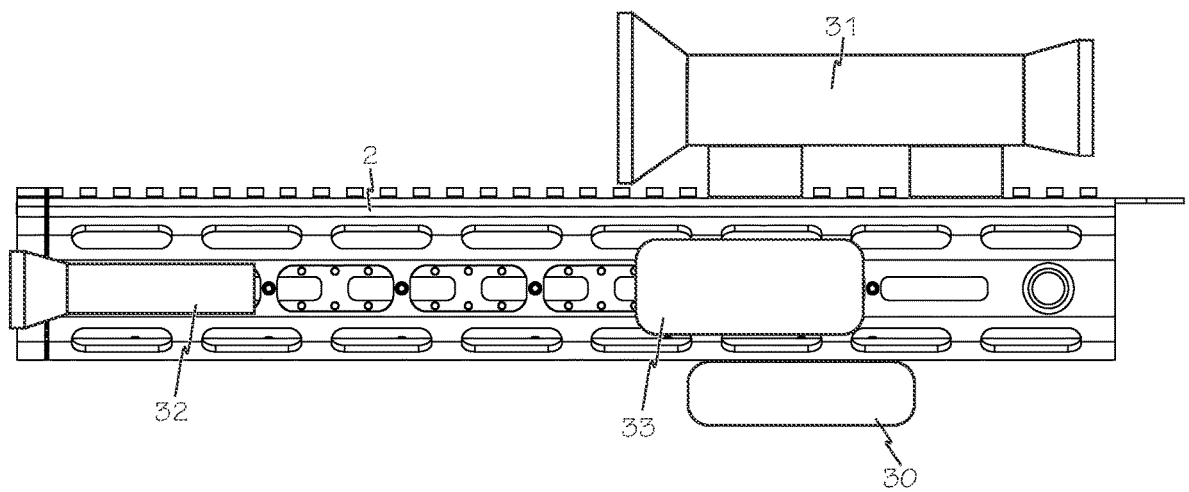
FIG. 10 is a left side view of the forearm handguard of FIG. 1 with attached accessories.
Figure 11:
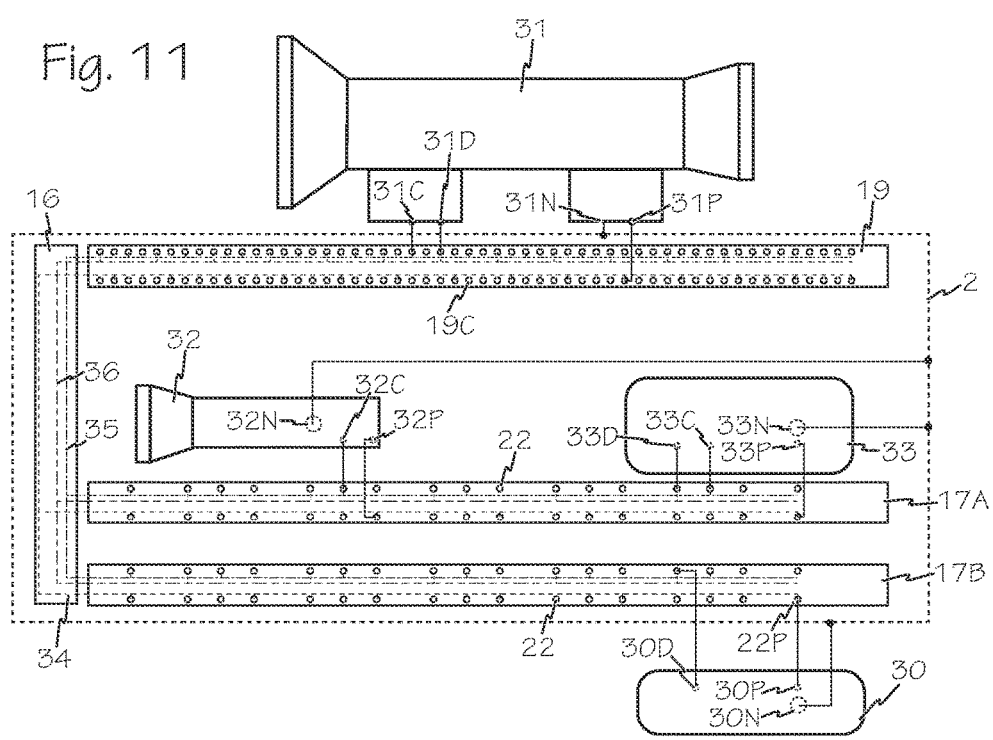
FIG. 11 is a block circuit diagram of the handguard and attached accessories of FIG. 10.

For example, accessories such as a power supply 30 may be connected to lower electronic rib 14B as illustrated in FIGS. 10 and 11. Optic 31 is connected to integrated top rail 13, a light 32 is attached to electronic rib 14A through any suitable hot M-LOK® attachment point and a controller/transceiver 33 is also attached to electronic rib 14A through any suitable hot M-LOK® attachment point. Power supply 30 has a positive polarity connector point 30P which contacts a positive power connection point 22P and negative polarity connector point 30N contacts handguard shell 2 to provide electric power between a set of positive power conductive traces 34 and the handguard shell 2. The polarity of the connectors may be different and the power circuit may use conductive traces for both the positive and negative conductors. Light 32 includes positive power connection point 32P which contacts a positive power connection point 22P and a negative power connection point 32N which contacts handguard shell 2 to complete the power circuit for the light. Optionally items such as light 32 may include a command contact such as command contact 32C which conducts command signals from first command traces 35 to the item, for example to turn the light 32 on and off.

Data channel 36 interconnects the power supply through power supply data connector 30D to provide data on the health of the power supply to the optic 31 to provide visual notification to a user of the status of the power supply. Data channel 36 may also be connected to the controller/transceiver 33 to process any data on the channel and/or to transmit the data via the transceiver to any suitable receiver.

While the preferred embodiments of the devices and methods have been described in reference to the environment in which they were developed, they are merely illustrative of the principles of the inventions. The elements of the various embodiments may be incorporated into each of the other species to obtain the benefits of those elements in combination with such other species, and the various beneficial features may be employed in embodiments alone or in combination with each other. Other embodiments and configurations may be devised without departing from the spirit of the inventions and the scope of the appended claims.

We claim:

1. A forearm handguard for a firearm comprising:
a handguard shell having a plurality of first attachment points extending through the shell operable for ventilation and an integrated top rail having a plurality of second attachment points;
a rail circuit board integrated into the top rail, the rail circuit board having at least one layer of conductive traces electrically accessible through at least one of the plurality of second attachment points;
one or more electronic ribs secured within the handguard shell, each of the one or more electronic ribs having an insulating base and cover enclosing a circuit board with at least one layer of conductive traces operably connected to a plurality of connection points within the shell accessible through at least one of the plurality of first attachment points, the plurality of connection points within the shell operable to electrically engage an electronic accessory through the shell;
a front connector plate having at least one layer of conductive traces operably connected to the at least one layer of conductive traces of the rail circuit board and the at least one layer of conductive traces of the one or more electronic ribs; and
a front cap covering and securing the front connector plate to the handguard shell.

2. The forearm handguard of claim 1 further comprising:
a power circuit comprising a set of positive power conductive traces operably connected to one or more connection points and a negative connection to the handguard shell.

3. The forearm handguard of claim 1 further comprising:
a power circuit comprising a set of negative power conductive traces operably connected to one or more connection points and a positive connection to the handguard shell.

4. The forearm handguard of claim 1 further comprising:
a power circuit comprising a set of positive power conductive traces operably connected to one or more connection points and a set of negative power conductive traces operably connected to one or more connection points.

5. The forearm handguard of claim 1 further comprising:
a data circuit comprising a set of conductive traces operably connected to one or more connection points and a negative connection to the handguard shell.

6. The forearm handguard of claim 2 further comprising:
a data circuit comprising a set of conductive traces operably connected to one or more connection points and a negative connection to the handguard shell.

7. The forearm handguard of claim 3 further comprising:
a data circuit comprising a set of conductive traces operably connected to one or more connection points and a negative connection to the handguard shell.

8. The forearm handguard of claim 4 further comprising:
a data circuit comprising a set of conductive traces operably connected to one or more connection points and a negative connection to the handguard shell.

9. The forearm handguard of claim 1 further comprising:
a command circuit comprising a set of conductive traces operably connected to one or more connection points and a negative connection to the handguard shell.

10. The forearm handguard of claim 2 further comprising:
a command circuit comprising a set of conductive traces operably connected to one or more connection points and a negative connection to the handguard shell.

11. The forearm handguard of claim 3 further comprising:
a command circuit comprising a set of conductive traces operably connected to one or more connection points and a negative connection to the handguard shell.

12. The forearm handguard of claim 4 further comprising:
a command circuit comprising a set of conductive traces operably connected to one or more connection points and a negative connection to the handguard shell.

13. The forearm handguard of claim 1 further comprising:
a power circuit comprising a set of positive power conductive traces operably connected to one or more connection points and a negative connection to the handguard shell;
a data circuit comprising a set of conductive traces operably connected to one or more connection points and a negative connection to the handguard shell; and
a command circuit comprising a set of conductive traces operably connected to one or more connection points and a negative connection to the handguard shell.

14. The forearm handguard of claim 1 further comprising:
a power circuit comprising a set of positive power conductive traces operably connected to one or more connection points and a negative connection to the handguard shell;
a data circuit comprising a set of conductive traces operably connected to one or more connection points and a negative connection to the handguard shell;
a command circuit comprising a set of conductive traces operably connected to one or more connection points and a negative connection to the handguard shell; and
a communication circuit comprising a first set of communication conductive traces operably connected to one or more connection points and a second set of communication conductive traces operably connected to one or more connection points.

15. The forearm handguard of claim 1 further comprising:
a power circuit comprising a set of positive power conductive traces operably connected to one or more connection points and a negative connection to the handguard shell;
two or more data circuits, each data circuit comprising a set of conductive traces operably connected to one or more connection points and a negative connection to the handguard shell;
a command circuit comprising a set of conductive traces operably connected to one or more connection points and a negative connection to the handguard shell; and
a communication circuit comprising a first set of communication conductive traces operably connected to one or more connection points and a second set of communication conductive traces operably connected to one or more connection points.

16. The forearm handguard of claim 1 further comprising:
a power circuit comprising a set of positive power conductive traces operably connected to one or more connection points and a negative connection to the handguard shell;
a data circuit comprising a set of conductive traces operably connected to one or more connection points and a negative connection to the handguard shell;
two or more a command circuits, each command circuit comprising a set of conductive traces operably connected to one or more connection points and a negative connection to the handguard shell; and
a communication circuit comprising a first set of communication conductive traces operably connected to one or more connection points and a second set of communication conductive traces operably connected to one or more connection points.

17. The forearm handguard of claim 1 further comprising:
a power circuit comprising a set of positive power conductive traces operably connected to one or more connection points and a set of negative power conductive traces operably connected to one or more connection points;
a data circuit comprising a first set of data conductive traces operably connected to one or more connection points and a second set of data conductive traces operably connected to one or more connection points;
a command circuit comprising a set of first set of command conductive traces operably connected to one or more connection points and a second set of command conductive traces operably connected to one or more connection points; and
a communication circuit comprising a first set of communication conductive traces operably connected to one or more connection points and a second set of communication conductive traces operably connected to one or more connection points.

* * * * *